(12) United States Patent
Lin

(10) Patent No.: US 9,740,262 B2
(45) Date of Patent: Aug. 22, 2017

(54) POWER SUPPLY DETECTING CIRCUIT

(71) Applicant: HON HAI PRECISION INDUSTRY CO., LTD., New Taipei (TW)

(72) Inventor: Ching-Chung Lin, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 429 days.

(21) Appl. No.: 14/459,941

(22) Filed: Aug. 14, 2014

(65) Prior Publication Data

US 2015/0054494 A1 Feb. 26, 2015

(30) Foreign Application Priority Data

Aug. 21, 2013 (CN) .......................... 2013 1 0365257

(51) Int. Cl.

| H02M 1/32 | (2007.01) |
|---|---|
| H02M 7/219 | (2006.01) |
| G05F 1/571 | (2006.01) |
| G05F 1/573 | (2006.01) |
| G06F 1/30 | (2006.01) |
| H02M 7/217 | (2006.01) |
| G06F 1/28 | (2006.01) |
| G01R 31/40 | (2014.01) |

(52) U.S. Cl.
CPC .............. G06F 1/305 (2013.01); G05F 1/571 (2013.01); G05F 1/573 (2013.01); G06F 1/28 (2013.01); H02M 1/32 (2013.01); H02M 7/217 (2013.01); H02M 7/219 (2013.01); G01R 31/40 (2013.01)

(58) Field of Classification Search
CPC ........ H02M 7/217; H02M 7/219; H02M 1/32; G05F 1/571; G05F 1/573
See application file for complete search history.

(56) References Cited

U.S. PATENT DOCUMENTS

| 5,793,623 A * | 8/1998 | Kawashima ........ H02M 1/4225 363/36 |
|---|---|---|
| 6,215,287 B1 * | 4/2001 | Matsushiro ......... H02M 1/4225 323/222 |
| 8,541,997 B2 * | 9/2013 | Jiang ................. H02M 3/33507 323/277 |
| 9,450,507 B2 * | 9/2016 | Pwu ...................... H02M 7/217 |
| 2002/0027786 A1 * | 3/2002 | Nakazawa ........ H02M 3/33507 363/21.05 |

(Continued)

*Primary Examiner* — Fred E Finch, III
*Assistant Examiner* — Sisay G Tiku
(74) *Attorney, Agent, or Firm* — Steven Reiss

(57) ABSTRACT

A power supply detecting circuit includes a first voltage detecting module configured to detect an input voltage of a power supply module; a micro control unit (MCU) connected to the first voltage detecting module; a display module connected to the MCU; a second voltage detecting module configured to detect an output voltage of the power supply module; and a current detecting module configured to detect an output current of the power supply module. The MCU is capable of comparing the detected input voltage, the detected output voltage, and the detected output current of the power supply module with corresponding predetermined parameters and calculating an output power of the power supply module. The display module is capable of displaying the detected input voltage, the detected output voltage, the detected output current, and the output power of the power supply module.

20 Claims, 2 Drawing Sheets

(56) References Cited

U.S. PATENT DOCUMENTS

| | | | | |
|---|---|---|---|---|
| 2004/0252534 | A1* | 12/2004 | Ryu | H02M 7/062 363/125 |
| 2006/0203524 | A1* | 9/2006 | Ohno | H02J 1/102 363/95 |
| 2006/0236013 | A1* | 10/2006 | Okeda | G05B 19/058 710/300 |
| 2010/0194307 | A1* | 8/2010 | Nonaka | H02M 1/32 315/294 |
| 2012/0281433 | A1* | 11/2012 | Yamanaka | H02M 7/003 363/13 |
| 2014/0285089 | A1* | 9/2014 | Akahoshi | H05B 33/089 315/127 |
| 2014/0347034 | A1* | 11/2014 | Yamada | G01R 19/155 324/76.11 |
| 2015/0078048 | A1* | 3/2015 | Lin | G01R 21/00 363/89 |
| 2016/0276988 | A1* | 9/2016 | Won | H03F 3/19 |

\* cited by examiner

POWER SUPPLY DETECTING CIRCUIT

CROSS-REFERENCE TO RELATED APPLICATIONS

This application claims priority to China Patent Application No. 201310365265.7 filed on Aug. 21, 2013 in the State Intellectual Property Office of China, the contents of which are incorporated by reference herein.

FIELD

The present disclosure relates to a power supply detecting circuit.

BACKGROUND

An electronic device, such as a computer, or a monitor, includes a power supply module which can be connected to an alternating current (AC) power source.

The power supply module can convert an AC voltage output from the AC power source to a plurality of direct current (DC) voltages. The DC voltages can be supplied to circuits and electronic components of the electronic device.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
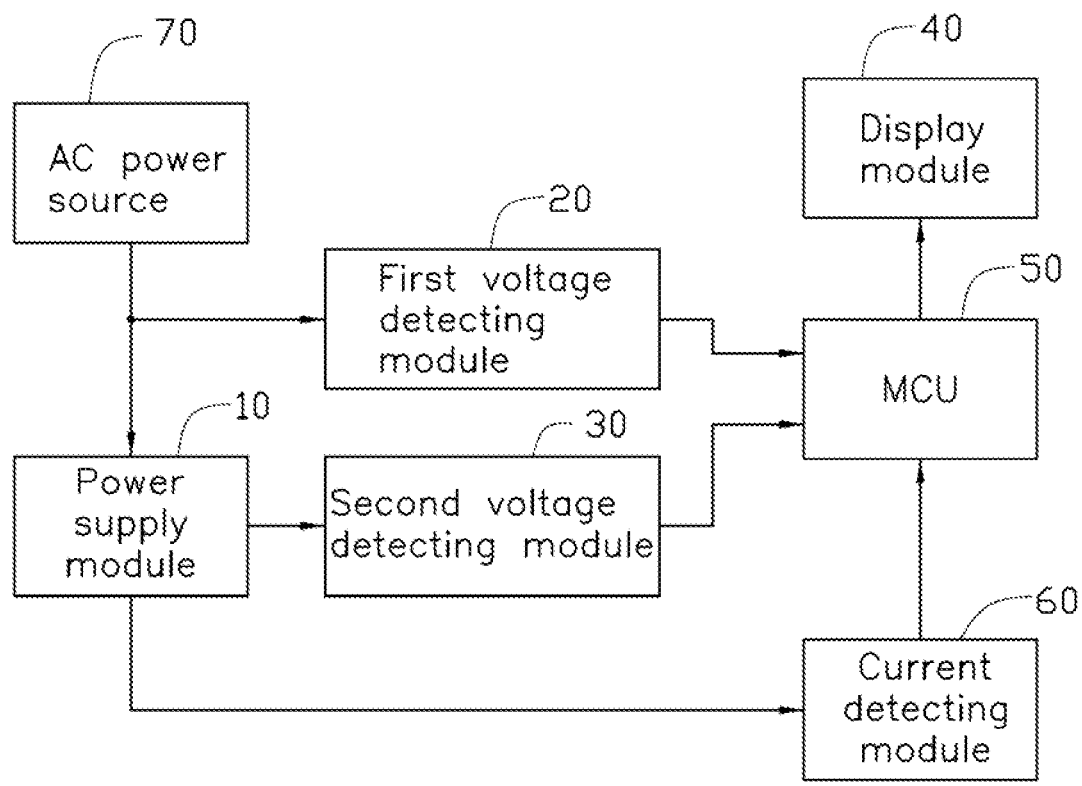
FIG. 1 is a block diagram of an embodiment of the power supply detecting circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIG. 1 illustrates an embodiment of a power supply detecting circuit includes a power supply module 10, a first voltage detecting module 20, a second voltage detecting module 30, a display module 40, a Micro Control Unit (MCU) 50, and a current detecting module 60. The power supply module 10 can convert an AC voltage supplied by the AC power source 70 to DC voltages (e.g., 3.3V, 5V, 12V) which can be fed to electric loads. The electric loads can be circuit boards, electronic modules, and electronic components of an electronic device (e.g., a monitor or a computer).

The first voltage detecting module 20 is connected to a voltage input terminal of the power supply module 10, and configured to detect the AC voltage provided to the power supply module 10. The second voltage detecting module 30 is connected to a voltage output terminal of the power supply module 10, and configured to detect the DC voltage output by the power supply module 10. The current detecting module 60 is connected to the power supply module 10, and configured to detect a current output by the power supply module 10. The first voltage detecting module 20, the second voltage detecting module 30, and the current detecting module 60 are connected to the MCU 50. The MCU 50 can receive voltages and current detected by the first voltage detecting module 20, the second voltage detecting module 30, and the current detecting module 60. The MCU 50 can compare the detected data with corresponding parameters and calculate an output power of the power supply module 10. The display module 40 is connected to the MCU 50 and can display the detected data, the output power of the power supply module 10. The MCU 50 can switch off the power supply module 10 when one or more of the detected data exceed predetermined parameters, thereby preventing damage to the electronic device due to over-current or over-voltage.

Figure 2:
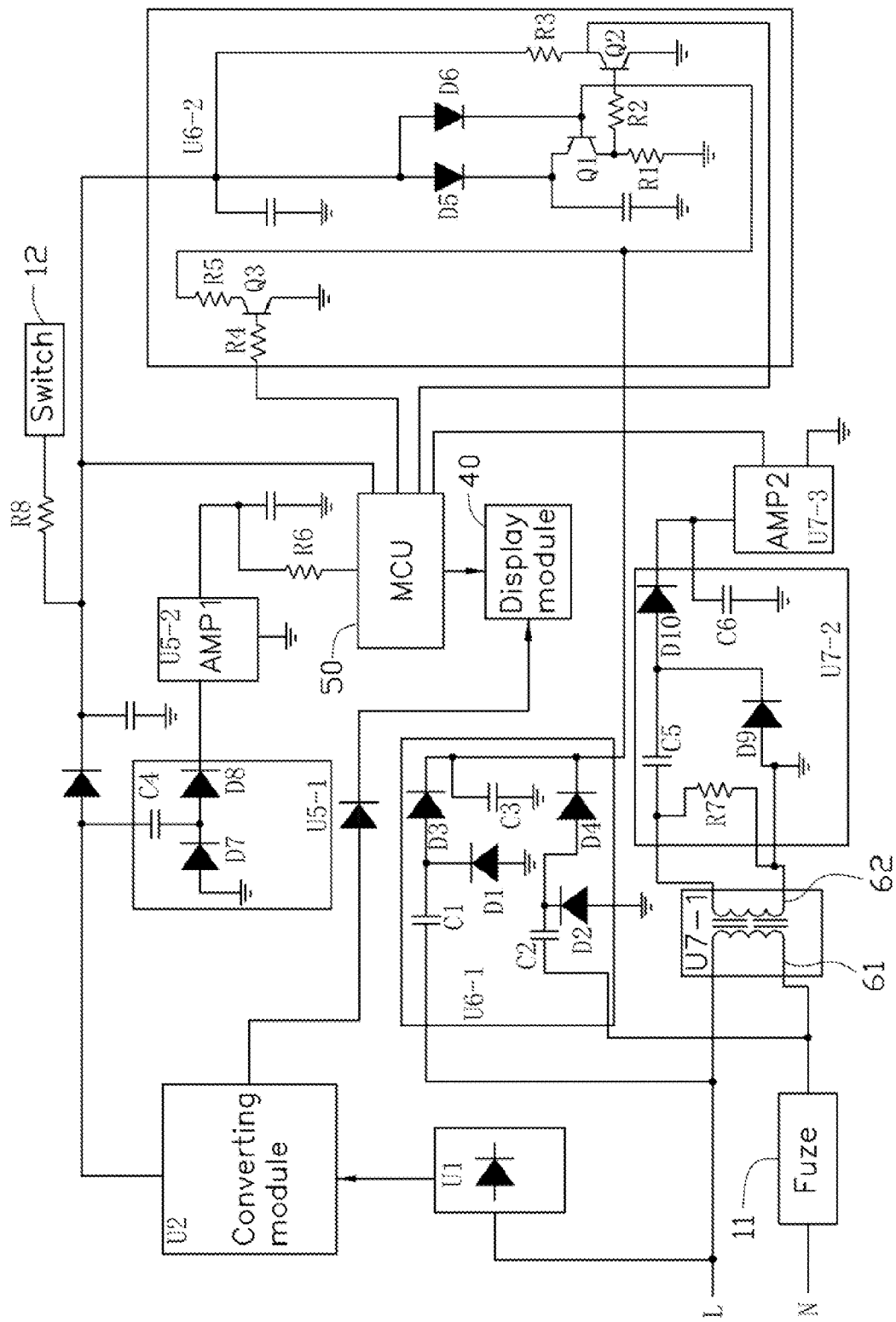
FIG. 2 illustrates a detailed circuit of the power supply detecting circuit of FIG. 1.

FIGS. 1 and 2 illustrate the power supply module 10 includes a first input terminal L and a second input terminal N. The first input terminal L can be connected to a live wire of the AC power source 70. The second input terminal N can be connected to a null wire of the AC power source 70. The power supply module 10 includes a bridge rectifier circuit U1 connected to the first input terminal L and a buck converter U2 connected to the bridge rectifier circuit U1. The bridge rectifier circuit U1 can convert an AC input into a DC output. The buck converter U2 can convert a voltage output from the bridge rectifier circuit U1 to a low DC voltage (e.g., 5V, 3.3V, or 12V). A fuze 11 is connected to the second input terminal N. When the first voltage detecting module 20 detects that the AC voltage supplied by the AC power source 70 is overvoltage, the fuze 11 disconnects the AC power source 70 from the power supply module 10.

FIGS. 1 and 2 illustrate the first voltage detecting module 20 includes a voltage converting circuit U6-1 connected to the first input terminal L and a switch circuit U6-2 connected to the voltage converting circuit U6-1. The voltage converting circuit U6-1 includes capacitors C1-C3 and diodes D1-D4. The diode D1-D4 can rectify the AC voltage output to the first input terminal L. The capacitor C1-C3 can filter the AC voltage output to the first input terminal L.

The switch circuit U6-2 includes a first transistor Q1, a second transistor Q2, a third transistor Q3, diodes D5-D6 and resistors R1-R5. In one embodiment, the first transistor Q1 is a PNP-type transistor. The second transistor Q2 and the third transistor Q3 are NPN-type transistors. When an output voltage of the voltage converting circuit U6-1 is greater than a voltage of a node A, the diode D6 is switched off. The first transistor Q1 is switched off. A base terminal of the second transistor Q2 is connected to ground via the resistors R1 and R2. The second transistor Q2 is switched off. A collector terminal of the second transistor Q2 is connected to the MCU 50 via the resistor R3 and is at a high-logic level (e.g., 5V). When the output voltage of the voltage converting circuit U6-1 is not greater than the predetermined voltage, the first transistor Q1 and the second transistor Q2 are switched on. The collector terminal of the second transistor Q2 is at a low-logic level. The MCU 50 can analyze the high-logic level signal and the low-logic level signal and judge whether the AC voltage supplied to the power supply module 10 is within a predetermined range.

The MCU 50 can output a signal to switch on or off the third transistor Q3. When the third transistor Q3 is switched on, the capacitor C3 can be discharged. When the third transistor Q3 is switched off, the capacitor C3 can be charged.

FIGS. 1 and 2 illustrate the second voltage detecting module 30 includes a voltage detecting unit U5-1 and a first amplifier U5-2 connected to the voltage detecting unit U5-1. The voltage detecting unit U5-1 includes a capacitor C4 and diodes D7-D8. One terminal of the capacitor C4 is connected to an output terminal of the buck converter U2. The other terminal of the capacitor C4 is connected to a positive terminal of the diode D8 and a negative terminal of the diode D7. A positive terminal of the diode D7 is grounded. A negative terminal of the diode D8 is connected to the first amplifier U5-2. The diodes D7-D8 and capacitor C4 can rectify and filter an output voltage of the buck converter U2 and output a rectified and filtered voltage to the first amplifier U5-2. The first amplifier U5-2 can amplify the rectified and filtered voltage output by the voltage detecting unit U5-1 and output an amplified voltage to the MCU 50 via a resistor R6. The MCU 50 calculates the output voltage of the power supply module 10 according to the amplified voltage output by the first amplifier U5-2.

FIGS. 1 and 2 illustrate the current detecting module 60 includes a transformer U7-1, a current detecting circuit U7-2 connected to the transformer U7-1, and a second amplifier U7-3 connected to the current detecting circuit U7-2. The transformer U7-1 includes a primary coil 61 and a secondary coil 62. One terminal of the primary coil 61 is connected to the first input terminal L. The other terminal of the primary coil 61 is connected to the second input terminal N. Two terminals of the secondary coil 62 are connected to the current detecting circuit U7-2. The current detecting circuit U7-2 includes a resistor R7, capacitors C5-C6, and diodes D9-D10. One terminal of the resistor R7 is connected to a first terminal of the secondary coil 62. The other terminal of the resistor R7 is connected to a second terminal of the secondary coil 62. One terminal of the capacitor C5 is connected to the first terminal of the secondary coil 62. The other terminal of the capacitor C5 is connected to a positive terminal of the diode D10. A negative terminal of diode D10 is connected to the second amplifier U7-3. The second terminal of the secondary coil 62 and a positive terminal of the diode D9 are grounded. A negative terminal of the diode D9 is connected to the positive terminal of the diode D10. One terminal of the capacitor C6 is connected to a negative terminal of the diode D10 and the second amplifier U7-3. The other terminal of the capacitor C6 is grounded. The transformer U7-1 can transform an input current flowing through the primary coil 61 to an output current flowing through the secondary coil 62. The current detecting circuit U7-2 can detect the output current flowing through the secondary coil 62. The diodes D9-D10 and capacitors C5-C6 can rectify and filter the output current and output the rectified and filtered current to the second amplifier U7-3. The second amplifier U7-3 amplifies the rectified and filtered current output by the current detecting circuit U7-2 and outputs the amplified current to the MCU 50. The MCU 50 can calculate the output current of the power supply module 10 according to the amplified current output by the second amplifier U7-3.

FIG. 2 illustrates the output terminal of the buck converter U2 is connected to a resistor R8 via a diode D11. A switch member 12 is connected to the resistor R8. In one embodiment, the switch member 12 can be transistor. The MCU 50 can control an on/off state of the switch member 12. The resistor R8 can be a dummy load. When the switch member 12 is switched off, the power supply module 10 can output current and voltage to the resistor R8. An input power, output power, and a power conversion efficiency of the power supply module 10 can be calculated.

The embodiments shown and described above are only examples. Many details are often found in the art such as the other features of an automatic power supply detecting circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A power supply detecting circuit comprising:
    a first voltage detecting module, connected to an input terminal of a power supply module, and configured to detect an input voltage of the power supply module;
    a micro control unit (MCU) connected to the first voltage detecting module;
    a display module connected to the MCU;
    a second voltage detecting module, connected to an output terminal of the power supply module, and configured to detect an output voltage of the power supply module; and
    a current detecting module, connected to the output terminal of the power supply module, and configured to detect an output current of the power supply module;
    wherein the current detecting module comprises a transformer, a second amplifier, and a current detecting circuit; the current detecting circuit comprises a resistor, a capacitor, and two diodes; the transformer is connected to the input terminal of the power supply module; the transformer comprises a secondary coil; the resistor of the current detecting circuit is connected between two output terminals of the secondary coil; the two diodes and the capacitor of the current detecting circuit are capable of rectifying and filtering a signal output by the transformer and sending the rectified and filtered signal to the second amplifier; the MCU is capable of comparing the detected input voltage of the power supply module, the detected output voltage of the power supply module, and the detected output current of the power supply module with corresponding predetermined parameters and calculating an output power of the power supply module; and the display module is capable of displaying the detected input voltage of the power supply module, the detected output voltage of the power supply module, the detected output current of the power supply module, and the output power of the power supply module.

2. The power supply detecting circuit of claim 1, wherein the second voltage detecting module comprises a voltage detecting unit and a first amplifier connected to the voltage detecting unit; the voltage detecting unit is capable of rectifying and filtering the output voltage of the power supply module, and the first amplifier is capable of amplifying a voltage output by the voltage detecting unit and sending the amplified voltage to the MCU.

3. The power supply detecting circuit of claim 2, wherein the voltage detecting unit comprises a capacitor and two diodes, the capacitor of the voltage detecting unit is connected to the output terminal of the power supply module and the two diodes of the voltage detecting unit, and the two diodes and capacitor of the voltage detecting unit are capable of rectifying and filtering the output voltage of the power supply module and sending the rectified and filtered voltage to the first amplifier.

4. The power supply detecting circuit of claim 1, wherein the transformer is connected to an alternating current (AC) power source which supplies the input voltage to the power supply module, the transformer is capable of transforming an input current flowing from the AC power source to the transformer to an output current.

5. The power supply detecting circuit of claim 4, wherein the transformer further comprises a primary coil, the primary coil is connected to the input terminal of the power supply module.

6. The power supply detecting circuit of claim 1, wherein the first voltage detecting module comprises a voltage converting circuit and a switch circuit, the voltage converting circuit is connected to the power supply module and capable of rectifying and filtering the input voltage of the power supply module, and the switch circuit is connected between the voltage detecting circuit and the MCU.

7. The power supply detecting circuit of claim 6, wherein the voltage converting circuit comprises a plurality of capacitors configured to filtering the AC input voltage of the power supply module and a plurality of diodes configured to rectifying the AC input voltage of the power supply module.

8. The power supply detecting circuit of claim 7, wherein the switch circuit comprises a first transistor and a second transistor, a base terminal of the first transistor is connected to an output terminal of the voltage converting circuit; an emitting terminal of the first transistor is connected to the output terminal of the power supply module, a collector terminal of the first transistor is connected to ground via a first resistor; a base terminal of the second transistor is connected to the collector terminal of the first transistor via a second resistor, a collector terminal of the second transistor is connected to the output terminal of the power supply module via a third resistor, and an emitter terminal of the second transistor is grounded.

9. The power supply detecting circuit of claim 8, wherein the first transistor is a PNP-type transistor, and the second transistor is an NPN-type transistor.

10. The power supply detecting circuit of claim 1, further comprising a fourth resistor connected to the output terminal of the power supply module and a switch connected to the fourth resistor.

11. A power supply detecting circuit comprising:
a power supply module capable of converting an alternating current (AC) input voltage supplied by an AC power source to a direct current (DC) output voltage;
a first voltage detecting module, connected to an input terminal of the power supply module, and configured to detect the AC input voltage;
a second voltage detecting module, connected to an output terminal of the power supply module, and configured to detect an output voltage of the power supply module;
a current detecting module, connected to the output terminal of the power supply module, and configured to detect an output current of the power supply module;
a micro control unit (MCU) connected to the first voltage detecting module, the second voltage detecting module, and the current detecting module; and
a display module connected to the MCU;
wherein the current detecting module comprises a transformer, a second amplifier, and a current detecting circuit; the current detecting circuit comprises a resistor, a capacitor, and two diodes; the transformer is connected to the input terminal of the power supply module; the transformer comprises a secondary coil; the resistor of the current detecting circuit is connected between two output terminals of the secondary coil; the two diodes and the capacitor of the current detecting circuit are capable of rectifying and filtering a signal output by the transformer and sending the rectified and filtered signal to the second amplifier; the MCU is capable of comparing the detected input voltage of the power supply module, the detected output voltage of the power supply module, and the detected output current of the power supply module with corresponding predetermined parameters and calculating an output power of the power supply module; and the display module is capable of displaying the detected input voltage of the power supply module, the detected output voltage of the power supply module, the detected output current of the power supply module, and the output power of the power supply module.

12. The power supply detecting circuit of claim 11, wherein the second voltage detecting module comprises a voltage detecting unit connected to the output terminal of the power supply module and a first amplifier connected to the voltage detecting unit; the voltage detecting unit is capable of rectifying and filtering the output voltage of the power supply module, and the first amplifier is capable of amplifying a voltage output by the voltage detecting unit and sending the amplified voltage to the MCU.

13. The power supply detecting circuit of claim 12, wherein the voltage detecting unit comprises a capacitor and two diodes, the capacitor of the voltage detecting unit is connected to the output terminal of the power supply module and the two diodes of the voltage detecting unit, and the two diodes and capacitor of the voltage detecting unit are capable of rectifying and filtering the output voltage of the power supply module and sending the rectified and filtered voltage to the first amplifier.

14. The power supply detecting circuit of claim 11, wherein the transformer is connected to the AC power source, the transformer is capable of transforming an input current flowing from the AC power source to the transformer to an output current.

15. The power supply detecting circuit of claim 14, wherein the transformer further comprises a primary coil, the primary coil is connected to the input terminal of the power supply module.

16. The power supply detecting circuit of claim 11, wherein the first voltage detecting module comprises a voltage converting circuit and a switch circuit, the voltage converting circuit is connected to the power supply module and capable of rectifying and filtering the AC input voltage, and the switch circuit is connected to the voltage detecting circuit and the MCU.

17. The power supply detecting circuit of claim 16, wherein the voltage converting circuit comprises a plurality of capacitors configured to filtering the AC input voltage and a plurality of diodes configured to rectifying the AC input voltage.

18. The power supply detecting circuit of claim 17, wherein the switch circuit comprises a first transistor and a second transistor, a base terminal of the first transistor is connected to an output terminal of the voltage converting circuit; an emitting terminal of the first transistor is connected to the output terminal of the power supply module, a collector terminal of the first transistor is connected to ground via a first resistor; a base terminal of the second transistor is connected to the collector terminal of the first transistor via a second resistor, a collector terminal of the second transistor is connected to the output terminal of the power supply module via a third resistor, and an emitter terminal of the second transistor is grounded.

19. The power supply detecting circuit of claim 18, wherein the first transistor is a PNP-type transistor, and the second transistor is an NPN-type transistor.

20. The power supply detecting circuit of claim 11, further comprising a fourth resistor connected to the output terminal of the power supply module and a switch connected to the fourth resistor.

* * * * *